(12) United States Patent
Matsumoto

(10) Patent No.: US 7,176,124 B2
(45) Date of Patent: Feb. 13, 2007

(54) METHOD FOR FABRICATING ELECTRONIC DEVICE

(75) Inventor: Susumu Matsumoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 176 days.

(21) Appl. No.: 10/923,827

(22) Filed: Aug. 24, 2004

(65) Prior Publication Data

US 2005/0048767 A1    Mar. 3, 2005

(30) Foreign Application Priority Data

Aug. 26, 2003    (JP) .............................. 2003-301927

(51) Int. Cl.
*H01L 21/4763*    (2006.01)
(52) U.S. Cl. ........................ 438/637; 438/639; 438/675
(58) Field of Classification Search ................ 438/618, 438/622, 627, 637, 639, 643, 653, 654, 687, 438/675
See application file for complete search history.

(56) References Cited

U.S. PATENT DOCUMENTS 6,893,953 B2 * 5/2005 Hoshino et al. ............. 438/618
6,949,457 B1 * 9/2005 Fiordalice et al. .......... 438/627

FOREIGN PATENT DOCUMENTS

JP    2000-323571 A    11/2000

* cited by examiner

*Primary Examiner*—Kevin M. Picardat
(74) *Attorney, Agent, or Firm*—McDermott Will & Emery LLP

(57) ABSTRACT

A method for fabricating an electronic device includes: a step of forming a first conductor to become a wiring or a wiring plug in a first insulating film; a step of forming a second insulating film on the first insulating film and the first conductor and, after that, forming a hole reaching the top face of the first conductor in the second insulating film; a step of forming a first barrier metal film on a bottom and side walls of the hole and on the second insulating film; a step of removing a portion formed on the bottom of the hole in the first barrier metal film to thereby expose the top face of the first conductor; a step of performing a plasma process using a reducing gas after the step of exposing the top face of the first conductor; and a step of forming a second conductor to become a wiring plug or a wiring by filling a conductive film in the hole after the step of performing the plasma process.

12 Claims, 8 Drawing Sheets

METHOD FOR FABRICATING ELECTRONIC DEVICE

CROSS-REFERENCE TO RELATED APPLICATION

All of the matters disclosed in the specification, drawings, and claims of Japanese Patent Laid-open No. 2003-301927 filed on Aug. 26, 2003 are incorporated by reference herein.

BACKGROUND OF THE INVENTION

The present invention relates to a method for fabricating an electronic device and, more particularly, to a wiring forming technique.

In recent years, reduction in size, higher packing density, and higher speed of a semiconductor integrated circuit are in demand and, accordingly, reduction in wiring resistance and wiring capacitance and improvement in reliability of a semiconductor integrated circuit are necessary. To realize reduction in wiring resistance and improvement in reliability of a semiconductor integrated circuit, copper wiring having specific resistance lower than that of a conventional aluminum alloy and having high reliability is used in practice.

To reduce wiring capacitance, an insulating film having a low dielectric constant (hereinbelow, called a low dielectric constant film), for example, a silicon oxide film containing carbon is started to be used in place of a conventional silicon oxide film. The lower dielectric constant of the low dielectric constant film is realized by reducing density of a silicon oxide film by making carbon in the form of an alkyl group or phenyl group of large volume exist in the silicon oxide film. Another method for lowering the dielectric constant by reducing density of the silicon oxide film by forming small pores in the silicon oxide film is also proposed.

To realize reduction in wiring resistance, reduction in wiring capacitance, and improvement in reliability of a semiconductor integrated circuit, a wiring technique obtained by combining copper wiring and a low dielectric constant film is increasingly becoming necessary.

As a first prior art, a damascene method generally used for copper wiring will be described.

A copper wiring forming method using dual damascene will be described as an example (refer to, for example, Japanese Patent Laid-open No. 2000-323571).

First, a wiring trench and a connection hole whose bottom reaches the top face of a lower layer wiring are formed in an interlayer insulating film formed on the lower layer wiring made by a copper film. After that and before a barrier metal film is formed on the wiring trench and the side wall and the bottom of the connection hole, sputter etching using argon gas is performed on the bottom of the connection hole, thereby removing a natural oxide film formed on the surface of the lower layer wiring exposed from the bottom of the connection hole. At the time of sputter etching, the surface of the lower layer wiring is sputtered, so that copper sputtered is deposited on the side wall of the connection hole. A barrier metal film is formed on the wiring trench and the side wall and bottom of the connection hole. After that, a copper film is filled in the wiring trench and the connection hole in which the barrier metal film is formed, thereby forming an upper layer wiring.

Since the copper deposited on the side wall of the connection hole by the sputter etching using argon gas is in direct contact with the interlayer insulating film, the deposit of copper moves into the interlayer insulating film in a following process such as a heating process, and it causes a problem such as a leak between wirings. Simultaneously, the copper of the lower layer wiring is diffused into the interlayer insulating film by using the deposit as a diffusion path, so that a problem such as stress migration that a void is generated in the lower layer wiring occurs.

Meanwhile, in a future device, use of a low dielectric constant film as the interlayer insulating film is in increasing demand. When the density of the interlayer insulating film accordingly becomes lower, diffusion of copper deposited on the side wall of the connection hole and copper of the lower layer wiring using the deposit as a diffusion path into the interlayer insulating film appears more conspicuously.

Further, the copper deposited on the side wall of the interlayer insulating film is not uniform, so that morphology is bad and rough. Consequently, a barrier metal film formed on the deposit of copper on the side wall of the interlayer insulating film is partially thinner as compared with the case where the barrier metal film is directly formed on the side wall of the interlayer insulating film. Therefore, as a semiconductor integrated circuit is becoming finer in the future, the thickness of the barrier metal film formed on the side wall of the interlayer insulating film is reduced, and the barrier metal film formed on the copper deposit on the side wall of the interlayer insulating film cannot assure sufficient film thickness. Moreover, a discontinuous part is created in the barrier metal film. As a result, an interface state having excellent adhesion between the barrier metal film and the copper film formed on the barrier metal film cannot be assured and a void nucleus forming site is created in the interface between the barrier metal film and the copper film. It causes poor reliability of a semiconductor integrated circuit, in particular, a problem such as electro-migration or stress migration.

When the barrier metal film has a thinned portion or a discontinued portion, a problem may occur after formation of wiring. Concretely, a trouble occurs due to heat generated in a heat treatment process in the upper wiring forming process performed after formation of the barrier metal film or heat generated at the time of a high-temperature storage test after completion of the device. For example, when heat is conducted to the wiring, the copper in the connection hole passes through the thin portion and the discontinuous portion in the barrier metal film and is diffused into the interlayer insulting film. As a result, a trouble related to stress migration such as generation of a leak current to the interlayer insulating film and formation of a void in the copper film of the connection hole occurs.

Therefore, as a countermeasure against the problems occurring in the first prior art, a second prior art has been examined.

To be specific, a method for reducing and removing a natural oxide film of copper formed on the bottom of a connection hole by performing a plasma process using hydrogen ($H_2$) gas as a reducing gas in place of sputter etching using argon gas in the first prior art has been examined. According to the method, since hydrogen is a light element, physical sputter etching is not carried out. Therefore, the copper of the lower layer wiring is not spread and deposited on the side wall of the connection hole.

As another countermeasure against the problems occurring in the first prior art, a third prior art has been examined.

To be specific, a method for forming a barrier metal film without performing sputter etching using argon gas to remove a natural oxide film formed on the surface of a lower layer wiring which is a copper film prior to formation of the barrier metal film, after that, removing the barrier metal film formed on the bottom of a connection hole and, further, removing the natural oxide film by sputter etching is proposed.

A method for fabricating an electronic device according to the third prior art will be described hereinbelow with reference to FIGS. 5A to 5C and FIGS. 6A and 6B.

As shown in FIG. 5A, a first insulating film 101 is formed on a substrate 100 and, by using damascene, a lower layer wiring 102 is formed in the first insulating film 101. Although not shown, the lower layer wiring 102 is obtained by stacking a barrier metal film 102a which is a tantalum nitride film and copper 102b in order. On the first insulating film 101 and the lower layer wiring 102, a barrier insulating film 103 for protecting the lower layer wiring 102, a second insulating film 104 which is a silicon oxide film, and a third insulating film 105 which is a silicon nitride film are formed sequentially. After that, by using lithography and dry etching technique, an opening 106 as a part of a connection hole is formed in the third insulating film 105.

As shown in FIG. 5B, a fourth insulating film 107 which is a silicon oxide film is formed on the third insulating film 105 including the opening 106. In such a manner, an interlayer insulating film 108 is formed by the second, third, and fourth insulating films 104, 105, and 107. Next, by using lithography and dry etching technique, a wiring trench 109 is formed in the fourth insulating film 107 so that the opening 106 exists in its bottom. Further, by using the third insulating film 105 as a mask, dry etching is performed successively on the second insulating film 104 and the barrier insulating film 103 to form a through hole which is communicated with the opening 106 and exposes the surface of the lower wiring 102 in the second insulating film 104 and the barrier insulating film 103 (hereinbelow, the through hole and the opening 106 will be called a connection hole 110).

As shown in FIG. 5C, a first barrier metal film 111 made of, for example, a tantalum nitride film is formed on the fourth insulating film 107 and each bottom and side wall of the wiring trench 109 and the connection hole 110 by sputtering. Unlike the first prior art, sputter etching is not performed before the first barrier metal film 111 is formed.

By etching back the first barrier metal film 111 by anisotropic etching, the first barrier metal film 111 formed on the bottom of the connection hole 110 is removed. In this case, the first barrier metal film 111 formed on the fourth insulating film 107 and the bottom of the wiring trench 109 is also removed.

By performing sputter etching using argon gas, a natural oxide film formed on the surface of the lower layer wiring 102 exposed from the bottom of the connection hole 110 is removed. In this case, a part of copper of the lower layer wiring 102 and the like is removed at the time of removing the natural oxide film, and a deposit 112 of copper and the like is made on the first barrier metal film 111 formed on the side walls of the connection hole 110 and the wiring trench 109.

After that, as shown in FIG. 6A, a second barrier metal film 113 which is, for example, a tantalum nitride film is formed by sputtering so as to cover the fourth insulating film 107, the first barrier metal film 111 formed on the side wall of the wiring trench 109, the third insulating film 105, and the first barrier metal film 111 formed on the side wall of the connection hole 110. Then, a copper film 114 as a seed layer used for electroplating is formed on the second barrier metal film 113 by sputtering.

As shown in FIG. 6B, copper is filled in the wiring trench 109 and the connection hole 110 by electroplating. After that, the copper and the second barrier metal film 113 formed on the fourth insulating film 107 are removed by chemical mechanical polishing (CMP) so that the copper filled in the wiring trench 109 and the connection hole 110 remains. In such a manner, an upper layer wiring 115 made of copper and the like is formed in the wiring trench 109, and a wiring plug made of copper and the like is formed in the connection hole 110.

As described above, in the third prior art, the first barrier metal film 111 is formed on each side wall and each bottom of the wiring trench 109 and the connection hole 110. After that, the first barrier metal film 111 formed on the bottom of the connection hole 110 is selectively removed by etch back to expose the surface of the lower layer wiring 102 from the bottom of the connection hole 111. Consequently, the first barrier metal film 111 remains on the side walls of the wiring trench 109 and the connection hole 110. By sputter-etching the bottom of the connection hole 110, the natural oxide film formed on the surface of the lower layer wiring 102 exposed from the bottom of the connection hole 110 can be removed. In this case, copper of the lower layer wiring 102 and the like removed by the sputter etching is deposited on the side wall of the connection hole 110 and the like. However, since the first barrier metal film 111 remains on the side wall of the connection hole 110, the deposit 112 of copper and the like does not come into direct contact with the interlayer insulating film 108. Consequently, copper of the deposit 112 does not move and diffuse into the interlayer insulating film 108.

SUMMARY OF THE INVENTION

As described above, in the method for fabricating an electronic device according to the first prior art, the deposit of copper on the side wall of the connection hole comes into direct contact with the interlayer insulating film by sputter etching using argon gas. The deposit of copper moves into the interlayer insulating film in a following process such as a heating process, so that it causes a problem such as a leak between wirings. In particular, in the case of using a low dielectric constant film as the interlayer insulating film, due to low density of the interlayer insulating film, diffusion of the copper deposited on the side wall of the connection hole into the interlayer insulating film becomes more conspicuous. Simultaneously, the copper of the lower layer wiring is diffused into the interlayer insulating film by using the deposit as a diffusion path, so that a problem such stress migration that a void is created in the lower layer wiring occurs.

When the thickness of the barrier metal film formed on the side wall of the interlayer insulating film decreases as a semiconductor integrated circuit is becoming finer, sufficient thickness of the barrier metal film formed on the deposit of copper on the side wall of the interlayer insulating film cannot be assured and, moreover, the barrier metal film comes to have a discontinuous portion. Consequently, an interface state of excellent adhesion between the barrier metal film and the copper film formed on the barrier metal film cannot be assured and a nucleus formation site of a void is generated in the interface between the barrier metal film and the copper film. It causes poor reliability of a semiconductor integrated circuit, particularly, a problem such as electro-migration or stress migration.

When the barrier metal film has a thin portion or a discontinuous portion, a failure may occur after formation of the wiring. Concretely, a failure occurs due to heat generated in a heat treatment process in the upper layer wiring forming process performed after formation of the barrier metal film or heat generated at the time of a high-temperature storage test after completion of the device. For example, when heat is conducted to the wiring, the copper in the connection hole passes through the thin portion or discontinuous portion in the barrier metal film and is diffused into the interlayer insulting film. As a result, a failure related to stress migration such as generation of a leak current to the interlayer insulating film and formation of a void in the copper film of the connection hole occurs.

In the method for fabricating an electronic device according to the second prior art, by performing a plasma process using hydrogen gas as reducing gas, the natural oxide film of copper formed on the bottom of the connection hole is reduced and removed. Due to reaction between the low dielectric constant film as the interlayer insulating film and the hydrogen gas, the dielectric constant increases.

Further, in the method for fabricating an electronic device according to the third prior art, at the time of sputter etching using argon gas, not only the copper of the lower layer wiring but also the natural oxide film formed on the surface of the lower layer wiring, residual polymer existing on the bottom of the connection hole which is not completely removed, and the like are sputter-etched and deposited as deposits on the side wall of the connection hole and the wiring trench. In the case where the connection hole is deviated from the lower layer wiring, the insulating film exposed in the connection hole is also sputter-etched and deposited as deposits on the side wall of the connection hole and the wiring trench.

FIG. 7 is a typical design layout using a lower layer wiring 121, a connection hole 122, and an upper wiring 123.

As shown in FIG. 7, when an electronic device becomes finer and the packing density becomes higher, generally, the lower and upper layer wirings 121 and 123 are designed without an alignment margin in lithography with respect to the connection holes 122.

Consequently, when electronic devices are actually manufactured, due to misalignment or dimensional variations occurring at the time of lithography for forming a connection hole or dimensional variations at the time of dry etching, generally, the electronic devices are manufactured in a state where the connection hole 122 is deviated from the lower layer wiring 121.

FIGS. 8A to 8C are cross sections corresponding to the processes shown in FIGS. 5C, 6A, and 6B, respectively and illustrate a state where the connection hole 110 is deviated from the lower layer wiring 102.

As shown in FIG. 8B, in a state where the connection hole 110 is deviated from the lower layer wiring 102, at the time of removing the natural oxide film formed on the surface of the lower layer wiring 102 by sputter etching using argon gas described in the process shown in FIG. 5A, the surface of the first insulating film 101 formed next to the lower layer wiring 102 exposed from the bottom of the connection hole 110 is sputter etched simultaneously with removal of the natural oxide film. Due to this, in addition to the copper of the lower layer wiring 102, the insulating film 117 is also deposited on the side wall of the first barrier metal film 111.

On the other hand, as a semiconductor device is becoming finer and the size of the connection hole is becoming smaller, coverage for the side wall of the connection hole decreases. Consequently, it becomes difficult to form a second barrier metal film having a sufficient thickness on the side wall of the connection hole. From the viewpoint of connection resistance, if the thickness of the second barrier metal film is not reduced, the film thickness ratio of the second barrier metal film occupying the bottom of the connection hole becomes high and the connection resistance in a wiring plug for connecting the lower and upper layer wirings becomes higher. Therefore, it is desirable to reduce the thickness of the second barrier metal film. Moreover, it will be necessary in the future to eliminate connection resistance between the lower and upper layer wirings by forming a copper film as a seed layer directly on the lower layer wiring without interposing the second barrier metal film on the bottom of the connection hole.

However, in a state where insulating substances such as the insulating film and the residual polymer are deposited in a mixed state on the side wall of the first barrier metal film, if the second barrier metal film formed on the first barrier metal film is thin, crystallinity of the second barrier metal film deteriorates. In a state where the crystallinity of the second barrier metal film is low, excellent wettability and adhesion to the copper film as a seed layer formed on the second barrier metal film cannot be assured. Also in the case where the copper film as a seed layer is directly formed on the first barrier metal film without forming the second barrier metal film, the insulating substances such as the insulating film and the residual polymer exist on the interface between the first barrier metal film and the copper film, so that excellent wettability and adhesion cannot be assured on the interface between the first barrier metal film and the copper film. If excellent wettability and adhesion is not assured on the interface between the first or second barrier metal film and the copper film, surface energy increases and a nucleus generation site of a void is generated. Therefore, a poor characteristic of filling to the connection hole and the wiring hole or, particularly, electro-migration and stress migration occurs, and the reliability of the semiconductor device deteriorates.

In view of the above, an object of the present invention is to provide a method for fabricating an electronic device, capable of realizing reduction in wiring capacitance and wiring resistance and higher reliability.

To achieve the object, the invention provides a first method for fabricating an electronic device including: a step of forming a first conductor to become a wiring or a wiring plug in a first insulating film; a step of forming a second insulating film on the first insulating film and the first conductor and, after that, forming a hole reaching the top face of the first conductor in the second insulating film; a step of forming a first barrier metal film on a bottom and a side wall of the hole and on the second insulating film; a step of removing a portion formed on the bottom of the hole in the first barrier metal film to thereby expose the top face of the first conductor; a step of performing a plasma process using a reducing gas after the step of exposing the top face of the first conductor; and a step of forming a second conductor to become a wiring plug or a wiring by filling a conductive film in the hole after the step of performing the plasma process.

According to the first method for fabricating an electronic device, after formation of the first barrier metal film, the step of exposing the top face of the first conductor is performed. Consequently, conductive substances such as copper removed from the first conductor at the time of exposing the top face of the first conductor can be prevented from coming into direct contact with the second insulating film and diffusing into the film, so that occurrence of a problem such as a leak between wirings can be prevented. By performing the plasma process using the reducing gas after the step of exposing the first conductor, insulating substances such as an oxide and a residual polymer generated at the time of exposing the top face of the first conductor and deposited on the hole can be reduced and removed. Consequently, crystallinity and wettability with the first barrier metal film and the conductive film filled in the hole are improved. Thus, the characteristic of filling the conductive film into the hole is improved, resistance to electro-migration and stress migration is increased, and the reliability of the semiconductor device improves. By the plasma process using a reducing gas, the film quality of the first barrier metal film is improved, and crystallinity and wettability between the first barrier metal film and the conductive film filled in the hole are improved, so that the characteristic of filling the conductive film into the hole is improved. Further, the first and second conductors can be directly connected to each other without interposing the first barrier metal film, so that increase in connection resistance between the first and second conductors can be suppressed.

Preferably, the first method for fabricating an electronic device further includes a step of forming a second barrier metal film on the first barrier metal film and the first conductor exposed in the hole, between the step of performing the plasma process and the step of forming the second conductor.

In this case, the second conductor is formed on the second barrier metal film and is not formed directly on insulating substances such as the oxide and residual polymer generated at the time of exposing the top face of the first conductor, so that the interface between the second conductor and the second barrier metal film is in an excellent state. Thus, the characteristic of filling the conductive film in the hole is further improved, and the reliability of the semiconductor device is further improved.

The invention provides a second method for fabricating an electronic device, comprising: a step of forming a first conductor to become a wiring or a wiring plug in a first insulating film; a step of forming a second insulating film on the first insulating film and the first conductor and, after that, forming a hole reaching the top face of the first conductor in the second insulating film; a step of forming a first barrier metal film on a bottom and side walls of the hole and on the second insulating film; a step of removing a portion formed on the bottom of the hole in the first barrier metal film to thereby expose the top face of the first conductor; a step of performing an annealing process using a reducing gas after the step of exposing the top face of the first conductor; and a step of forming a second conductor to become a wiring plug or a wiring by filling a conductive film in the hole after the step of performing the annealing process.

According to the second method for fabricating an electronic device, after formation of the first barrier metal film, the step of exposing the top face of the first conductor and removing a natural oxide film is performed. Consequently, conductive substances such as copper removed from the first conductor at the time of exposing the top face of the first conductor can be prevented from coming into direct contact with the second insulating film and diffusing into the film, so that occurrence of a problem such as a leak between wirings can be prevented. By performing the annealing process using the reducing gas after the step of exposing the first conductor, insulating substances such as an oxide and a residual polymer generated at the time of exposing the top face of the first conductor and deposited on the hole can be reduced and removed. Consequently, crystallinity and wettability with the first barrier metal film and the conductive film filled in the hole are improved. Thus, the characteristic of filling the conductive film into the hole is improved, resistance to electro-migration and stress migration is increased, and the reliability of the semiconductor device improves. By the annealing process using a reducing gas, the film quality of the first barrier metal film is improved, and crystallinity and wettability between the first barrier metal film and the conductive film filled in the hole are improved, so that the characteristic of filling the conductive film into the hole is improved. Further, the first and second conductors can be directly connected to each other without interposing the first barrier metal film, so that increase in connection resistance between the first and second conductors can be suppressed.

Preferably, the second method for fabricating an electronic device further includes a step of forming a second barrier metal film on the first barrier metal film and the first conductor exposed in the hole, between the step of performing the annealing process and the step of forming the second conductor.

In this case, the second conductor is formed on the second barrier metal film and is not formed directly on insulating substances such as the oxide and residual polymer generated at the time of exposing the top face of the first conductor, so that the interface between the second conductor and the second barrier metal film is in an excellent state. Thus, the characteristic of filling the conductive film in the hole is further improved, and the reliability of the semiconductor device is further improved.

Preferably, each of the first and second methods for fabricating an electronic device further includes a step of performing an annealing process using a reducing gas between the step of forming the hole and the step of forming the first barrier metal film.

In such a manner, by removing, for example, a natural oxide film formed on the first conductor to a certain extent, cleanliness of the interface between the first conductor and the first barrier metal film formed on the first conductor is improved. Consequently, insulating substances such as the oxide and residual polymer generated at the time of exposing the first conductor can be effectively reduced and removed by the following process using the reducing gas.

In the first and second methods for fabricating an electronic device, preferably, the step of exposing the top face of the first conductor includes at least a step of removing the first barrier metal film in the hole on the first conductor. In this case, it is more preferable that the step of exposing the top face of the first conductor includes a step of making the first barrier metal film formed on the side walls of the hole and on the outside of the hole remain.

Since the first barrier metal film formed on the side walls of the hole and on the outside of the hole remains, the conductive substances such as copper removed from the first conductor at the time of exposing the top face of the first conductor can be reliably prevented from coming into direct contact with the second insulating film and diffusing into the film. Thus, occurrence of a problem such as a leak between wirings can be prevented with reliability. The second insulating film can be also reliably prevented from being damaged by the process using a reducing gas.

In the first and second methods for fabricating an electronic device, preferably, the second insulating film is a low dielectric constant film.

In this case, wiring capacitance can be reduced. Moreover, since the first barrier metal film is formed on the side walls of the hole, the second insulating film is not damaged by the process using a reducing gas. Therefore, the dielectric constant of the low dielectric constant film can be prevented from increasing.

DETAILED DESCRIPTION OF THE INVENTION

Hereinafter, preferred embodiments of the invention will be described with reference to the drawings.

Embodiment 1

A method for fabricating an electronic device according to a first embodiment of the invention will be described with reference to FIGS. 1A to 1D and FIGS. 2A to 2D.

FIGS. 1A to 1D and FIGS. 2A to 2D are cross sections each showing a state where an electronic device is designed without an alignment margin between a connection hole and a wiring formed in a lower layer, and the connection hole is deviated from the wiring formed in the lower layer due to misalignment or dimensional variations which occur at the time of lithography for forming the connection hole or dimensional variations which occur at the time of dry etching.

Figure 1A:
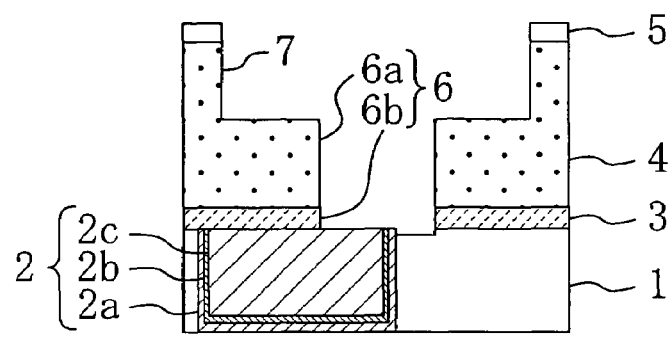
FIGS. 1A to 1D are cross sections showing a method for fabricating an electronic device according to a first embodiment.

As shown in FIG. 1A, first, a first wiring trench pattern is formed by photolithography in a first insulating film 1 made of a silicon oxide film formed on a silicon substrate (not shown), and dry etching is performed on the first insulating film 1, thereby forming a first wiring trench having a depth of 250 nm in the first insulating film 1.

Next, a film having a thickness of 10 nm which is aligned well with an insulating film, for example, a tantalum nitride film 2a and a film having a thickness of 10 nm which is aligned well with a conductive film, for example, a tantalum film 2b are sequentially formed in the first wiring trench. A copper film (not shown) as a seed layer having a thickness of 80 nm is deposited on the tantalum film 2b, and copper 2c having a thickness of 600 nm is deposited by electroplating. The resultant is subjected to heat treatment, for example, at 150° C. for 120 minutes in nitrogen atmosphere and the surface is planarized by CMP, thereby forming a first wiring 2 made of the tantalum nitride film 2a, tantalum film 2b, and copper 2c.

On the first insulating film 1 and the first wiring 2, a barrier insulating film 3 which is a silicon carbon nitride film having a thickness of, for example, 50 nm and suppresses diffusion of copper is deposited. The barrier insulating film 3 also has the role of an etching stopper film for stopping dry etching performed at the time of forming a connection hole which will be described later.

On the barrier insulating film 3, a second insulating film 4 which is a silicon oxide film containing carbon as a low dielectric constant film (dielectric constant $\leqq 3$) and has a thickness of 500 nm is deposited.

After that, a third insulating film 5 having a thickness of 50 nm is formed on the second insulating film 4. The third insulating film 5 has the role of protecting the second insulating film 4 as a low dielectric constant film from a damage or the like caused by ashing after dry etching which will be described later. For example, a silicon oxide film formed by plasma CVD using TEOS is used as the third insulating film 5.

A connection hole pattern is formed by photolithography in the third insulating film 5 and, after that, the third and second insulating films 5 and 4 are etched, thereby forming a first through hole 6a. A photoresist used at the time of etching is removed by ashing. In the etching, the barrier insulating film 3 is not etched and is left.

To form a second wiring trench pattern, an organic plug is formed in the first through hole 6a, an organic anti-reflection film and a resist are coated on the third insulating film 5 and the organic plug and, after that, the second wiring trench pattern is exposed. The third and second insulating films 5 and 4 are etched with the second wiring trench pattern, thereby forming a second wiring trench 7.

Then, the photoresist is removed and cleaning is performed. After that, the entire surface is etched to remove the barrier insulating film 3 exposed from the bottom of the first through hole 6a to form a second through hole 6b communicated with the first through hole 6a. In such a manner, a connection hole 6 constructed by the first and second through holes 6a and 6b and reaching the top face of the first wiring 2 is formed.

Figure 1B:
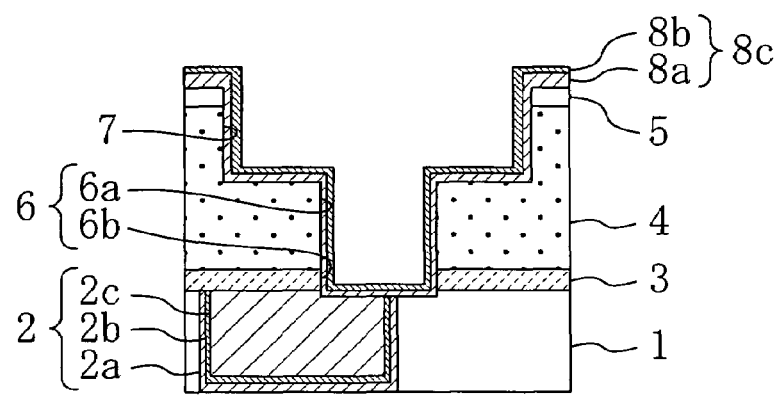

As shown in FIG. 1B, in the connection hole 6 and the second wiring trench 7, a first barrier metal film 8c obtained by sequentially forming a tantalum nitride film 8a having a thickness of 10 nm and a tantalum film 8b having a thickness of 15 nm is formed by sputtering. As described above, different from the first and second prior arts, sputter etching using argon gas or plasma process using reducing gas which will be described later is not performed before the first barrier metal film 8c is formed by sputtering.

Figure 1C:
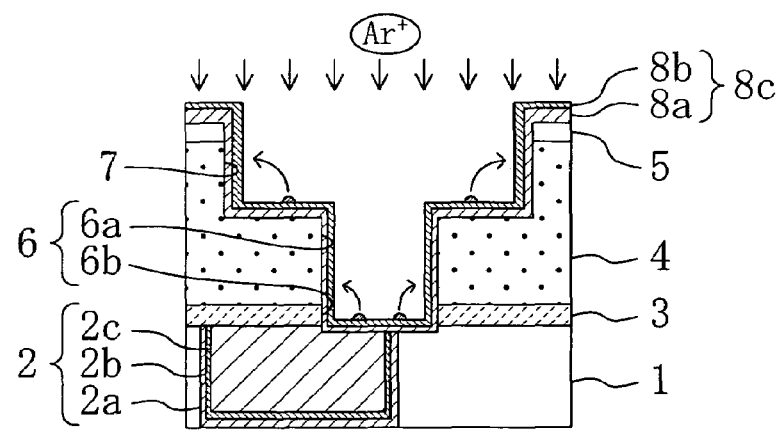

As shown in FIG. 1C, by performing sputter etching using argon gas, the tantalum nitride film 8a and the tantalum film 8b exposed from the bottom of the connection hole 6 are removed and the natural oxide film existing on the interface between the first wiring 2 and the first barrier metal film 8c is removed.

Figure 1D:
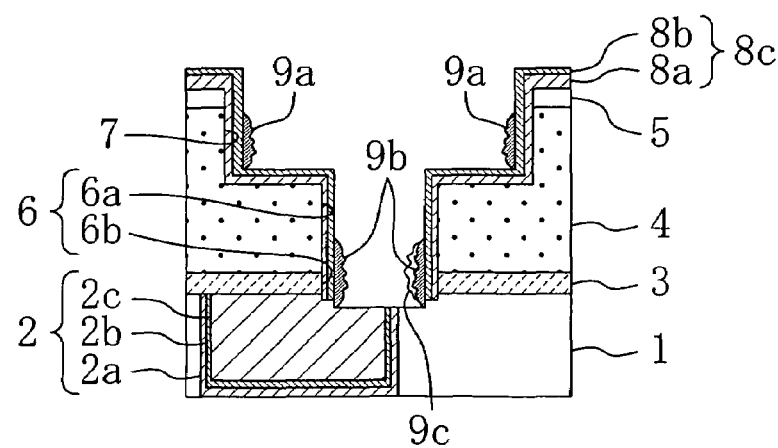

The sputter etching using argon gas is performed so that, as shown in FIG. 1D to be described later, the first barrier metal film 8c formed on the bottom of the second wiring trench 7 and on the third insulating film 5 remains. In particular, the tantalum nitride film 8a as a component of the first barrier metal film 8c does not have high wettability with a copper film 8d to be formed later, so that it is desirable to perform etching so as to leave the tantalum film 8b having high wettability with copper.

In the case of forming the first barrier metal film 8c by sputtering, coverage in the connection hole 6 is lower than that in the second wiring trench 7, so that the first barrier metal film 8c formed on the bottom of the connection hole 6 is thinner than the first barrier metal film 8c formed on the bottom of the second wiring trench 7 and on the third insulating film 5. Therefore, by using such a film thickness difference, the etching can be performed so as to leave the tantalum film 8b on the bottom of the second wiring trench 7 and on the third insulating film 5 while removing the tantalum nitride film 8a and the tantalum film 8b on the bottom of the connection hole 6.

Since the tantalum nitride film 8a and the tantalum film 8b exposed from the bottom of the connection hole 6 are removed by sputter etching, the degree of etching on the bottom is higher than that on the side walls of the connection hole 6 and the second wiring trench 7. Thus, the first barrier metal film 8c formed on the bottom of the connection hole 6 can be removed so that the first barrier metal film 8c formed on the side walls of the connection hole 6 and the second wiring trench 7 remain. Since the first barrier metal film 8c formed on the side walls of the connection hole 6 and the second wiring trench 7 remains as described above, conductive substances such as copper removed from the first wiring 2 at the time of exposing the top face of the first wiring 2 can be reliably prevented from coming into direct contact with the second insulating film 4 and being diffused into the film. Thus, occurrence of a problem such as a leak between wirings can be prevented with reliability. The second insulating film 4 can be also reliably prevented from being damaged by a process using a reducing gas.

The tantalum nitride film 8a formed on the bottom of the second wiring trench 7 removed by sputter etching using argon gas is deposited as a first deposit 9a on the side wall of the second wiring trench 7. The first deposit 9a has the role of compensating insufficient coverage of the first barrier metal film 8c formed on the side wall of the second wiring trench 7. Similarly, copper of the tantalum film Sb, tantalum nitride film 8a, and first wiring 2 formed on the bottom of the connection hole 6 which are removed by sputter etching using argon gas is deposited as a second deposit 9b on the side wall of the connection hole 6. The tantalum and tantalum nitride in the second deposit 9b have the role of compensating insufficient coverage of the first barrier metal film 8c formed on the side wall of the connection hole 6.

On the other hand, in a portion where the first insulating film 1 is formed below the first barrier metal film 8c on the bottom of the connection hole 6 due to deviation of the connection hole 6 from the first wiring 2, the first insulating film 1 is also removed together with the first barrier metal film 8c by sputter etching using argon gas. Consequently, not only the second deposit 9b but also a third deposit 9c of an oxide exist on the side wall of the connection hole 6. The second and third deposits 9b and 9c include the natural oxide film existing on the interface between the first wiring 2 and the first barrier metal film 8c and a residual polymer and the like existing on the bottom of the connection hole 6.

Figure 2A:
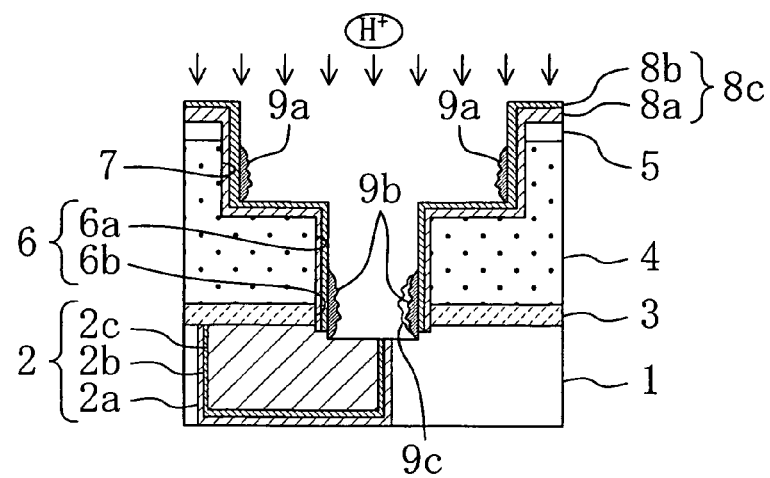
FIGS. 2A to 2D are cross sections showing the method for fabricating an electronic device according to the first embodiment.
Figure 2B:
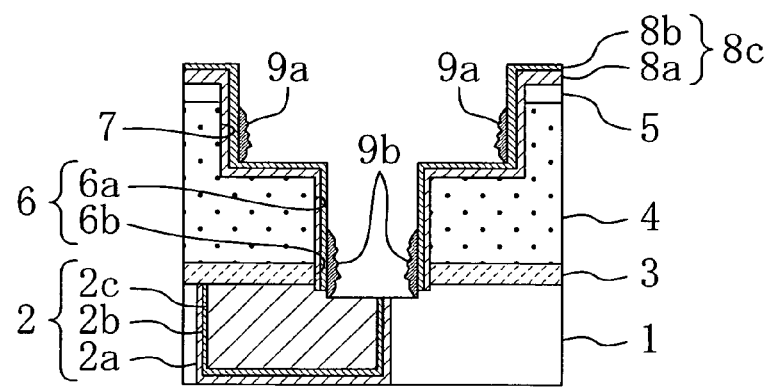

Subsequently, as shown in FIG. 2A, a plasma process using hydrogen gas as a reducing gas is performed. By reducing and removing an oxide, a residual polymer, and the like included in the second and third deposits 9b and 9c, as shown in FIG. 2B, insulating substances included in the second and third deposits 9b and 9c are removed. By performing plasma process using a reducing gas, the surface of the first barrier metal film 8c is improved, so that the crystal grain of the first barrier metal film 8c and that of the copper film 8d as a seed layer formed on the first barrier metal film 8c match with each other more easily. Therefore, crystallinity and wettability of the interface between the first barrier metal film 8c and the copper film 8d as a seed layer are improved, and the characteristic of filling to the first wiring trench 7 and the connection hole 6 and reliability of preventing a failure such as electro-migration and stress migration are improved.

Figure 2C:
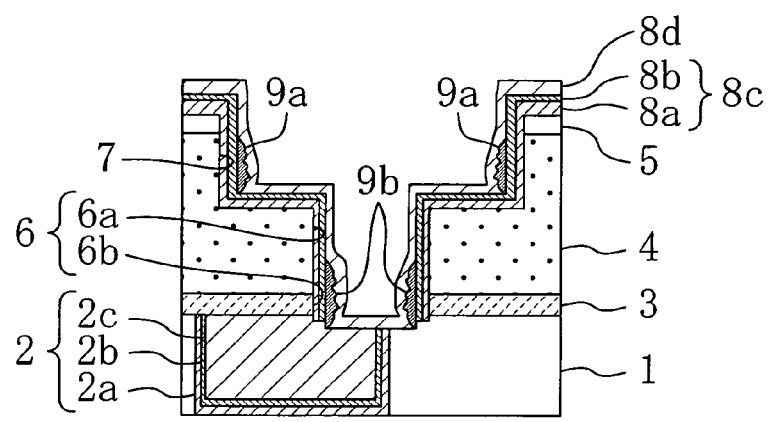

As shown in FIG. 2C, the copper film 8d as a seed layer having a thickness of 80 nm is formed on the bottom of the connection hole 6 from which the surface of the first wiring 2 and the first insulating film 1 is exposed and on the first barrier metal film 8c.

Figure 2D:
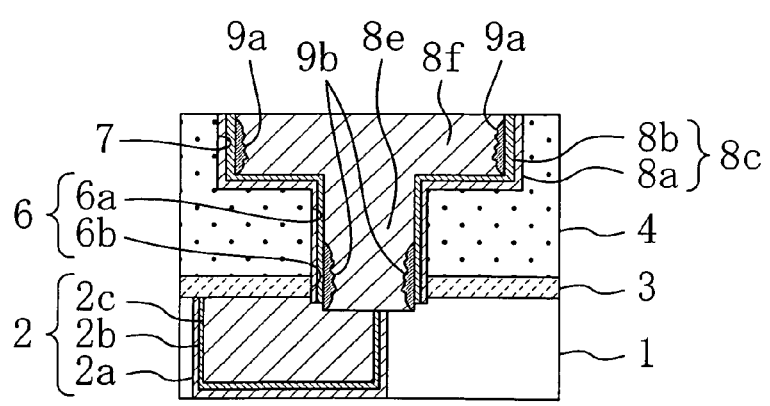

As shown in FIG. 2D, a copper film having a thickness of 600 nm is filled in the connection hole 6 and the second wiring trench 7 by using electroplating, the resultant is subjected to heat treatment in nitrogen atmosphere, for example, at 150° C. for 120 minutes and, after that, the surface is planarized by CMP. In such a manner, the first barrier metal film 8c and a wiring plug 8e made of copper are formed in the connection hole 6, and the first barrier metal film 8c and a second wiring 8f made of copper are formed in the second wiring trench 7.

In the first embodiment, it is preferable to continuously perform the processes from the process of forming the tantalum nitride film 8a and the tantalum film 8b forming the first barrier metal film 8c to the process of forming the copper film 8d as a seed layer in the same apparatus without exposing the device to the atmosphere.

As described above, according to the first embodiment, the first barrier metal film 8c is formed and, after that, sputter etching using argon gas is performed, thereby removing a natural oxide film, residual polymer, and the like existing on the interface between the first barrier metal film 8c and the first wiring 2. Consequently, different from the case of performing sputter etching using argon gas before formation of the first barrier metal film 8c (refer to, for example, the first prior art), the copper of the first wiring 2 removed by etching and the insulating film as the side wall of the connection hole 6 do not come into direct contact with each other, the copper can be prevented from being diffused into the insulating film and, as a result, occurrence of a problem such as a leak between wirings can be prevented.

Since the plasma process using a reducing gas is not performed before formation of the first barrier metal film 8c, for example, different from the second prior art, the insulating film as a low dielectric constant film can be prevented from being damaged by the reducing gas. As a result, increase in the dielectric constant of the low dielectric constant film can be prevented.

As the first barrier metal film 8c is formed without performing sputter etching using argon gas, the barrier metal film can be formed on the side face having little roughness on which deposits hardly exist. Thus, a barrier metal film having relatively uniform thickness can be formed and the film thickness can be reduced.

By performing the plasma process using hydrogen gas after the sputter etching using argon gas, the insulating substances such as the oxide and residual polymer included in the first to third deposits 9a to 9c can be reduced and removed. Consequently, excellent wettability and adhesion can be assured in the interface between the first barrier metal film 8c and the copper film 8d as the seed layer formed on the first barrier metal film 8c. Thus, the characteristic of filling to the connection hole 6 and the second wiring trench 7 is improved and the reliability of preventing a failure such as electro-migration and stress migration is improved.

At the time of performing the plasma process using hydrogen gas, not the bottom of the connection hole 6 but the side walls of the connection hole 6, the side walls and bottom of the second wiring trench 7, and the surface of the third insulating film 5 are covered with the first barrier metal film 8c, so that the second insulating film 4 as a low dielectric constant film can be prevented from being damaged by the plasma process using hydrogen gas. As a result, increase in the dielectric constant of the low dielectric constant film can be prevented.

On the bottom of the connection hole 6, the first barrier metal film 8c is removed by sputter etching using argon gas and, after that, the copper film 8d as the seed layer is formed. By electroplating, copper is filled in the connection hole 6 and the second wiring trench 7. Therefore, the first barrier metal film 8c does not interpose on the bottom of the wiring plug 8e connecting the first wiring 2 and the second wiring 8f, and the first and second wirings 2 and 8f are connected to each other only via copper. Thus, reduction in connection resistance between the first and second wirings 2 and 8f can be realized and, in addition, since atoms freely move, resistance to electro-migration is improved.

Although the sputter etching using argon gas, the plasma process using a reducing gas, and the like are not performed prior to formation of the tantalum nitride film 8a and the tantalum film 8b as a first barrier metal film in the first embodiment, it is preferable to perform an annealing process using hydrogen gas as a reducing gas. For example, by performing annealing process using hydrogen gas at 150 to 400° C. for 30 seconds in the same apparatus as the sputtering apparatus, a natural oxide film formed on the first wiring 2 can be removed to a certain extent. The cleanliness of the interface between the first wiring 2 and the first barrier metal film 8c formed on the first wiring 2 is improved. Therefore, insulating substances such as an oxide and residual polymer generated at the time of exposing the first wiring 2 can be effectively reduced and removed by the following process using the reducing gas. Since the interface is cleaned by the annealing process as described above, the second insulating film 4 as a low dielectric constant film is not damaged.

Although the case of forming the first barrier metal film 8c by sputtering has been described in the first embodiment, the first barrier metal film 8c may be formed by CVD. In this case, when the plasma process using reducing gas is performed, the film quality, for example, crystallinity of the first barrier metal film 8c formed by CVD can be improved. Therefore, effects such as higher density of the first barrier metal film 8c, reduction of impurities in the film, and removal of impurities in the film are produced. Thus, the characteristic of filling to the connection hole 6 and the second wiring trench 7 is improved and resistance to electro-migration and stress migration is improved, so that reliability is improved.

Although the dual damascene method for simultaneously filling copper into the connection hole 6 and the second wiring trench 7 has been described in the first embodiment, obviously, the invention can be similarly carried out by a single damascene method for filling copper into each of the connection hole 6 and the second wiring trench 7.

In the first embodiment, the insulating substances such as the oxide and residual polymer deposited on the side walls of the connection hole 6 and the second wiring trench 7 are removed by the plasma process using reducing gas in the process shown in FIG. 2A. The insulating substances such as the oxide and residual polymer can be similarly reduced also in the case of performing an annealing process using reducing gas in place of the plasma process using reducing gas. Therefore, also in the case of performing the annealing process using reducing gas, effects similar to the above can be obtained.

Although the case where the first barrier metal film 8c formed before sputter etching using argon gas has the two-layered structure in which the tantalum nitride film 8a and the tantalum film 8b are stacked has been described in the first embodiment, the first barrier metal film 8c may have a single-layer structure of the tantalum film 8b having high wettability with a copper film as the seed layer or a single-layer structure of the tantalum nitride film 8a.

The low dielectric constant film used in the embodiment may be an organic film (SiOC, BCB, MSQ, FLARE, or porous organic film), a film containing a methyl group or benzene ring, an inorganic film (HSQ or porous SiO), and the like.

Embodiment 2

A method for fabricating an electronic device according to a second embodiment of the invention will now be described with reference to FIGS. 3A to 3C and FIGS. 4A to 4C.

First, in the second embodiment, the processes shown in FIGS. 1A and 1B in the first embodiment are performed in a manner similar to the first embodiment.

Figure 3A:
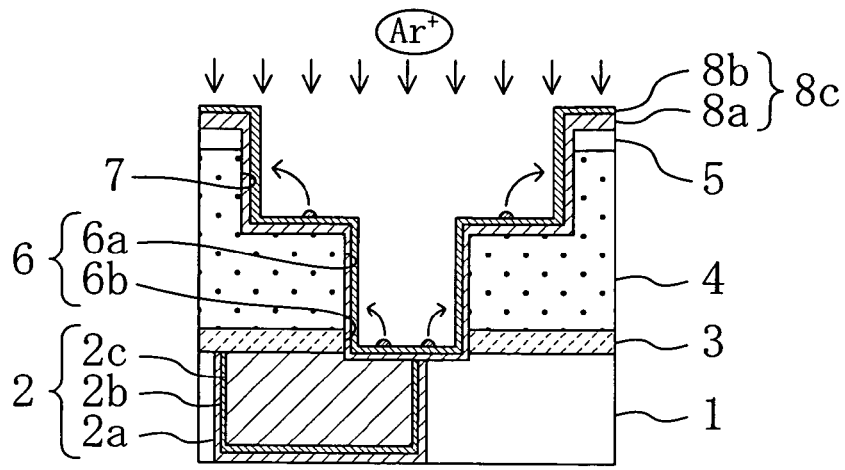
FIGS. 3A to 3C are cross sections showing a method for fabricating an electronic device according to a second embodiment.

Next, by performing sputter etching using argon gas as shown in FIG. 3A, the tantalum nitride film 8a and the tantalum film 8b exposed from the bottom of the connection hole 6 are removed and a natural oxide film existing on the interface with the first barrier metal film 8c is removed.

Figure 3B:
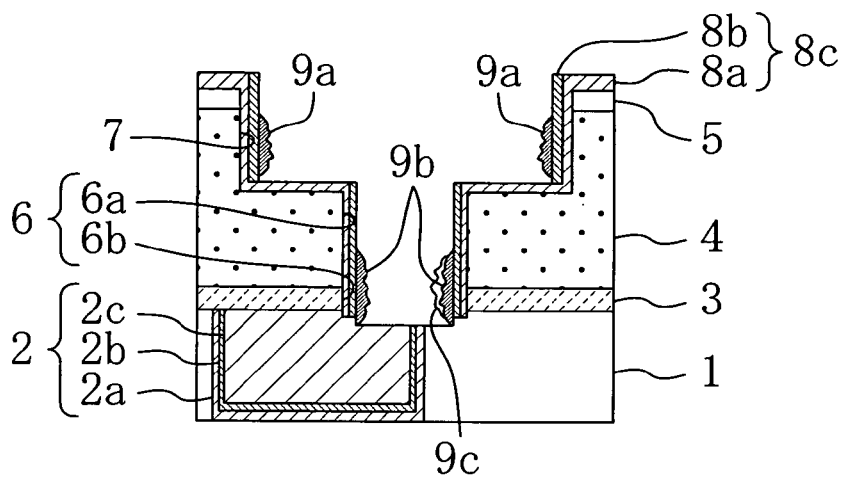

The sputter etching using argon gas is performed so that the first barrier metal film 8c formed on the bottom of the second wiring trench 7 and the surface of the third insulating film 5 exist as shown in FIG. 3B which will be described later. Alternately, etching may be performed so that the tantalum film 8b remains in a manner similar to the foregoing first embodiment or etching may be performed so that the tantalum film 8b does not remain. In the second embodiment, an example of removing the tantalum film 8b formed on the bottom of the second wiring trench 7 and on the surface of the third insulating film 5 while making the tantalum nitride film 8a remain will be described. As will be stated later, a second barrier metal film 8g which is a tantalum film having high wettability with copper is formed on the first barrier metal film 8c, so that there is no much necessity to make the tantalum film 8b as a component of the first barrier metal film 8c remain.

In the case of forming the first barrier metal film 8c by sputtering, coverage of the connection hole 6 is lower than that of the second wiring trench 7. Therefore, the first barrier metal film 8c formed on the bottom of the connection hole 6 is thinner than the first barrier metal film 8c formed on the bottom of the second wiring trench 7 and the surface of the third insulating film 5. Therefore, by using the film thickness difference, etching can be carried out so that the tantalum nitride film 8a remains while removing the tantalum nitride film 8a and the tantalum film 8b on the bottom of the connection hole 6 and removing the tantalum film 8b on the bottom of the second wiring trench 7 and the surface of the third insulating film 5.

Since the tantalum nitride film 8a and the tantalum film 8b exposed from the bottom of the connection hole 6 are removed by sputter etching, the degree of etching on the bottom is higher than that on the side walls of the connection hole 6 and the second wiring trench 7. Therefore, the first barrier metal film 8c formed on the bottom of the connection hole 6 can be removed so that the first barrier metal film 8c formed on the side walls of the connection hole 6 and the second wiring trench 7 remain. As described above, the first barrier metal film 8c formed on the side walls of the connection hole 6 and the second wiring trench 7 remains, at the time of exposing the top face of the first wiring 2, the conductive substance such as copper removed from the first wiring 2 can be reliably prevented from coming into direct contact with the second insulating film 4 and being diffused into the film. Thus, occurrence of a problem of a leak between the wirings can be prevented with reliability. The second insulating film 4 can be reliably prevented from being damaged by the process using reducing gas.

The tantalum film 8b formed on the bottom of the second wiring trench 7 removed by sputter etching using argon gas is deposited as the first deposit 9a on the side wall of the second wiring trench 7. The deposit 9a has the role of compensating insufficient coverage of the first barrier metal film 8c formed on the side wall of the second wiring trench 7. Similarly, the tantalum film 8b, tantalum nitride film 8a and the copper of the first wiring 2 formed on the bottom of the connection hole 6 removed by the sputtering etching using argon gas are deposited as the second deposit 9b on the side wall of the connection hole 6. The tantalum and tantalum nitride contained in the second deposit 9b have the role of compensating insufficient coverage of the first barrier metal film 8c formed on the side wall of the connection hole 6.

On the other hand, in the portion where the first insulating film 1 is formed below the first barrier metal film 8c on the bottom of the connection hole 6 since the connection hole 6 is deviated from the first wiring 2, the first insulating film 1 is also removed together with the first barrier metal film 8c by sputter etching using argon gas. Consequently, not only the second deposit 9b but also the third deposit 9c of an oxide exist on the side wall of the connection hole 6. The second and third deposits 9b and 9c include a natural oxide film existing on the interface between the first wiring 2 and the first barrier metal film 8c and a residual polymer existing on the bottom of the connection hole 6.

Figure 3C:
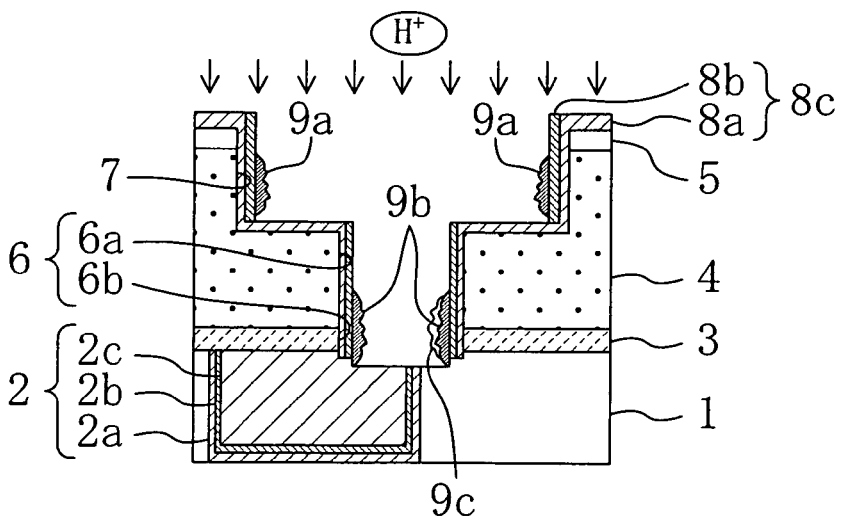
Figure 4A:
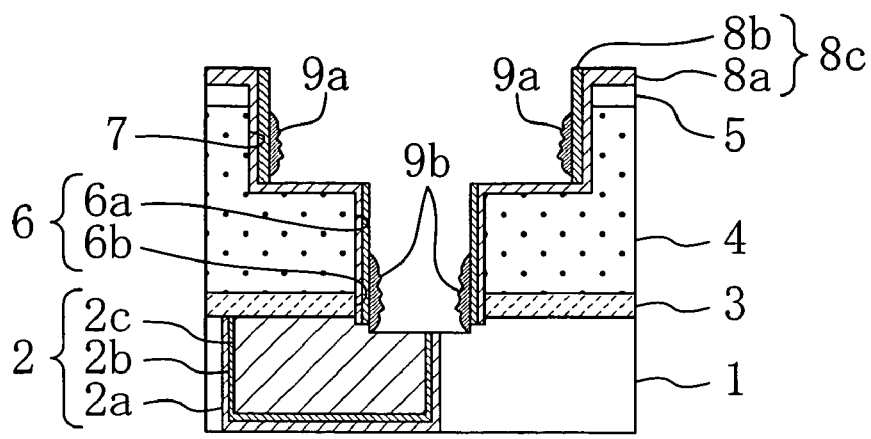
FIGS. 4A to 4C are cross sections showing the method for fabricating an electronic device according to the second embodiment.

After that, as shown in FIG. 3C, a plasma process using hydrogen gas as a reducing gas is performed. By reducing and removing an oxide, a residual polymer, and the like included in the second and third deposits 9b and 9c, as shown in FIG. 4A, insulating substances included in the second and third deposits 9b and 9c are removed. By performing the plasma process using reducing gas, the surface of the first barrier metal film 8c is improved, so that the crystal grain of the first barrier metal film 8c and that of the second barrier metal film 8g formed on the first barrier metal film 8c match with each other more easily. Therefore, crystallinity and wettability of the interface between the first and second barrier metal films are improved, so that the characteristic of filling to the first wiring trench 7 and the connection hole 6 is improved, and reliability of preventing a failure such as electro-migration and stress migration is improved.

Figure 4B:
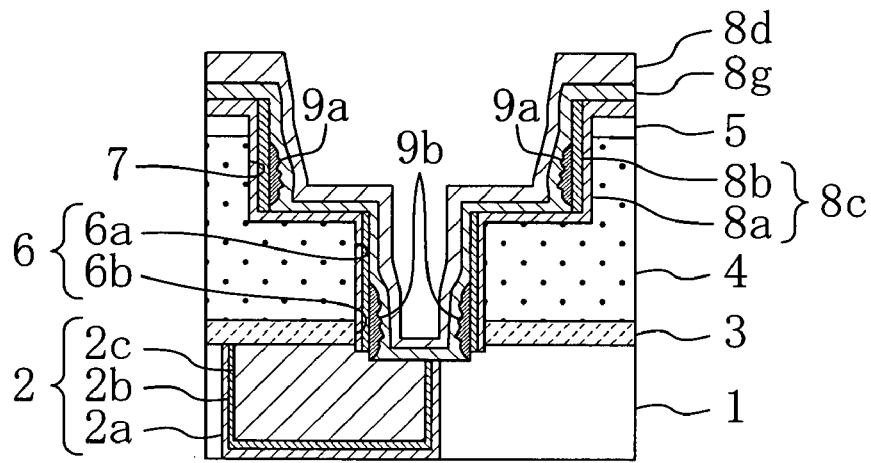

As shown in FIG. 4B, the second barrier metal film 8g which is a tantalum film having a thickness of 10 nm and the copper film 8d as a seed layer having a thickness of 80 nm are sequentially formed on the bottom of the connection hole 6 from which the surface of the first wiring 2 and the first insulating film 1 is exposed and on the first barrier metal film 8c.

Figure 4C:
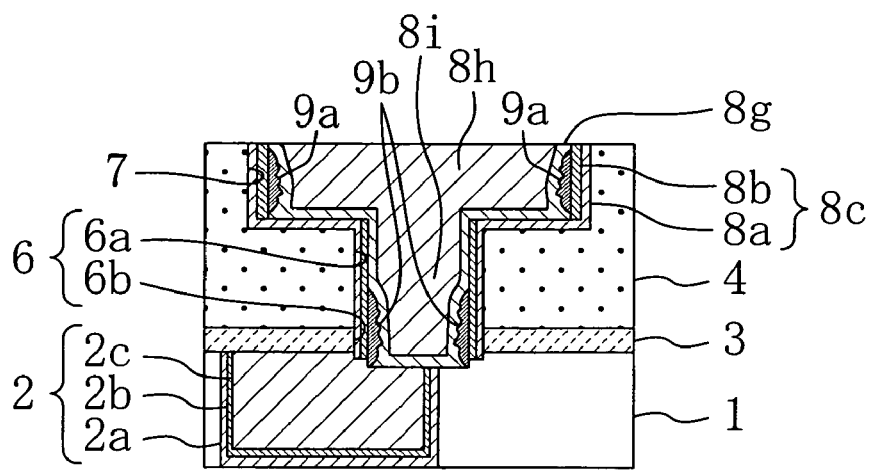
Figure 5A:
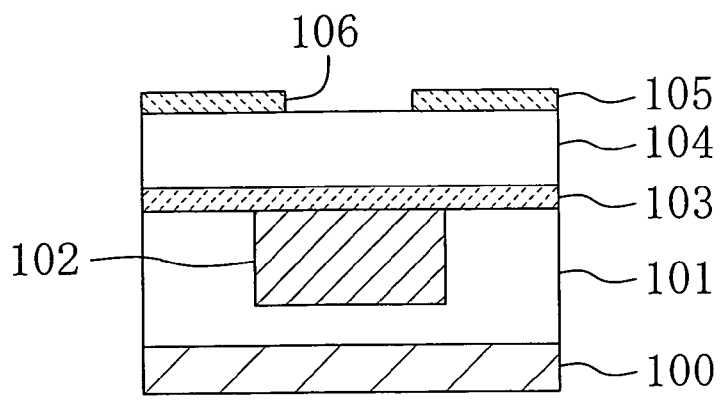
FIGS. 5A to 5C are cross sections showing a conventional method for fabricating an electronic device.
Figure 5B:
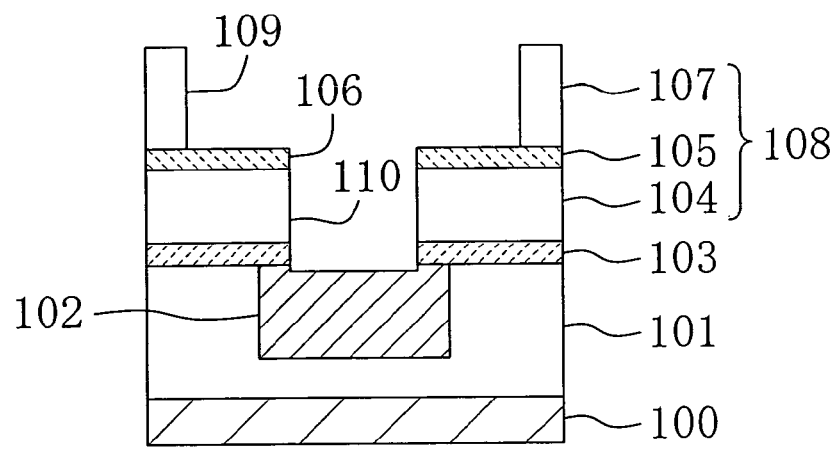
Figure 5C:
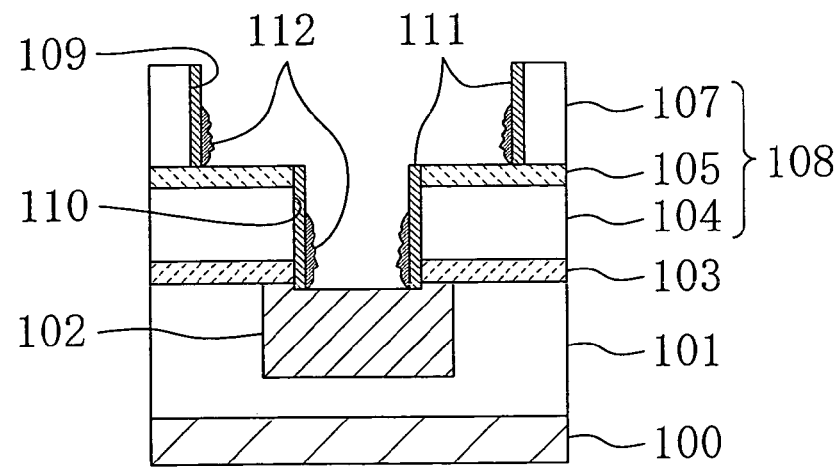
Figure 6A:
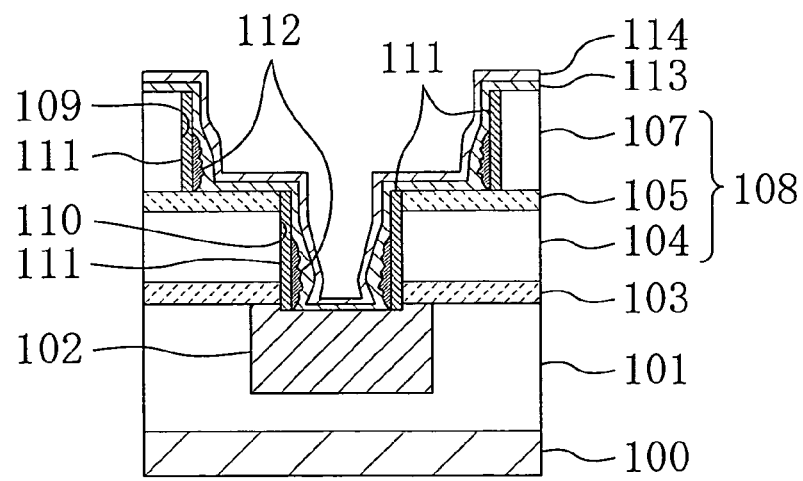
FIGS. 6A and 6B are cross sections showing a conventional method for fabricating an electronic device.
Figure 6B:
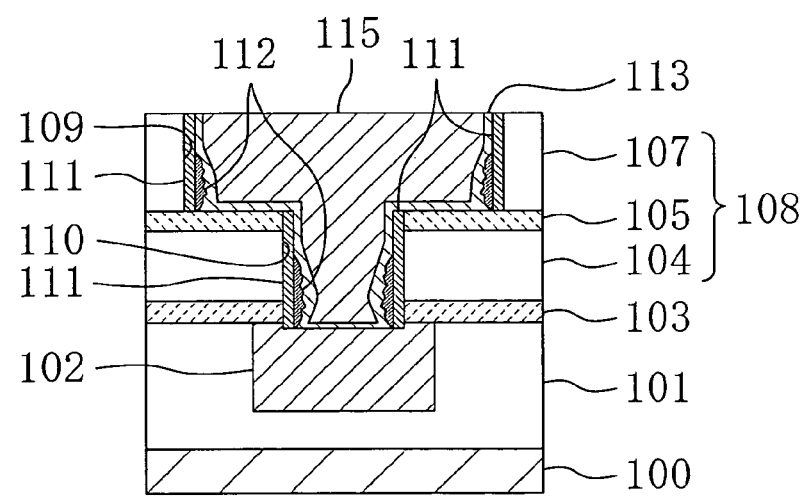
Figure 7:
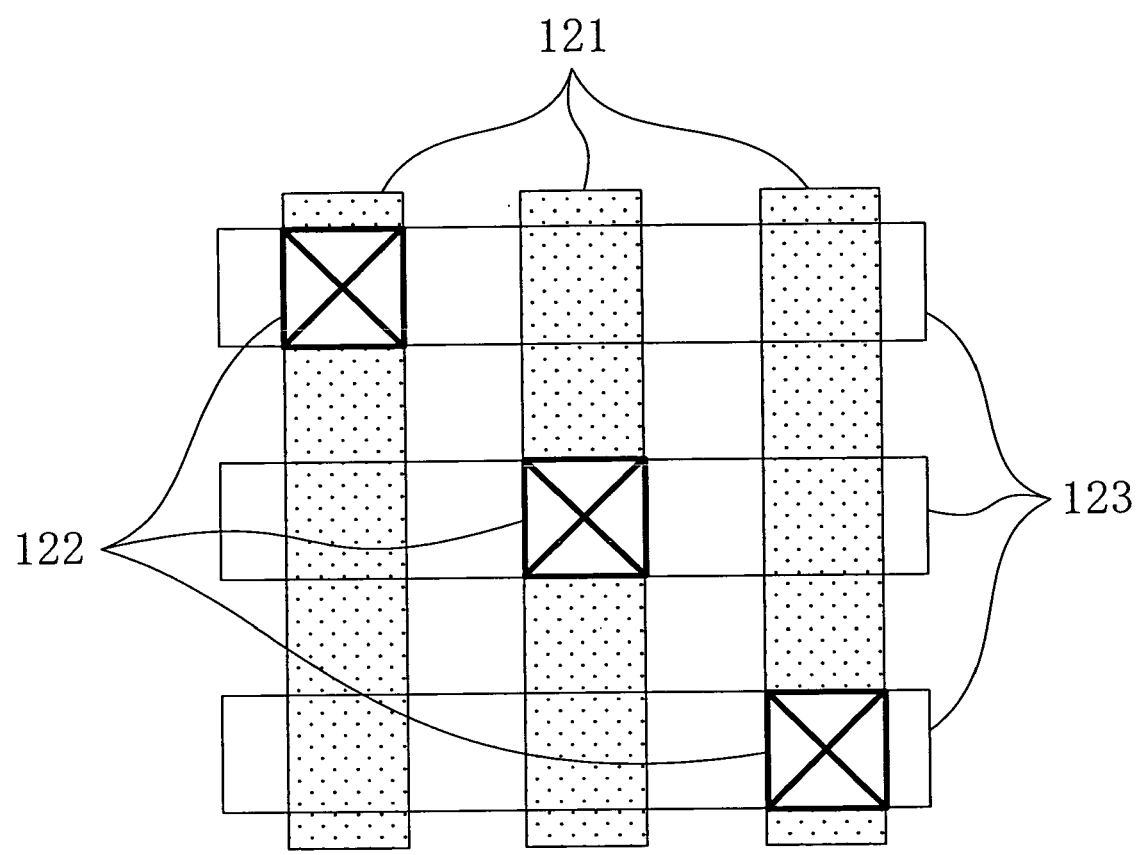
FIG. 7 is a typical design layout of an electronic device.
Figure 8A:
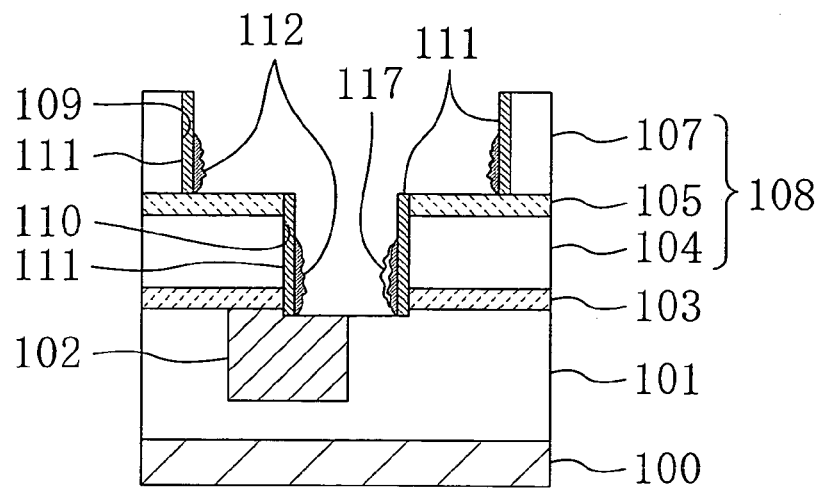
FIGS. 8A to 8C are cross sections showing a method for fabricating an electronic device in the case where a connection hole is deviated from a lower layer wiring.
Figure 8B:
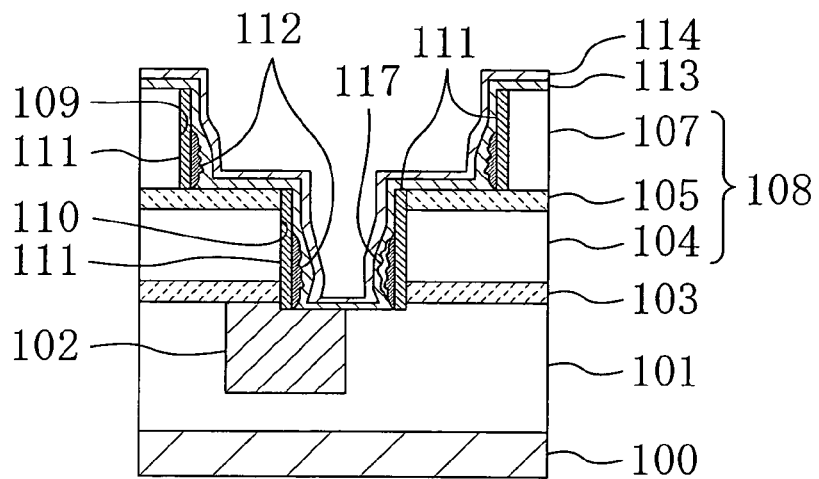
Figure 8C:
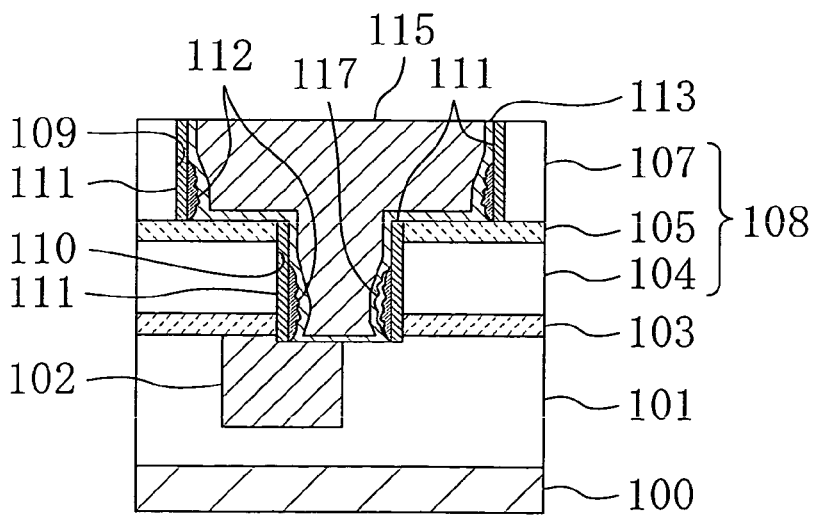

As shown in FIG. 4C, copper having a thickness of 600 nm is filled in the connection hole 6 and the second wiring trench 7 by using electroplating, the resultant is subjected to heat treatment in nitrogen atmosphere, for example, at 150° C. for 120 minutes and, after that, the surface is planarized by CMP. In such a manner, a wiring plug 8h made of the first barrier metal film 8c, the second barrier metal film 8g, and copper is formed in the connection hole 6, and a second wiring 8i made of the first barrier metal film 8c, the second barrier metal film 8g, and copper is formed in the second wiring trench 7.

In the second embodiment, it is preferable to continuously perform the processes from the process of forming the tantalum nitride film 8a and the tantalum film 8b forming the first barrier metal film 8c to the process of forming the copper film 8d as a seed layer in the same apparatus without exposing the device to the atmosphere.

As described above, according to the second embodiment, the first barrier metal film 8c is formed and, after that, sputter etching using argon gas is performed, thereby removing a natural oxide film, residual polymer, and the like existing on the interface between the first barrier metal film 8c and the first wiring 2. Consequently, different from the case of performing sputter etching using argon gas before formation of the first barrier metal film 8c (refer to, for example, the first prior art), the copper of the first wiring 2 removed by etching and the insulating film as the side wall of the connection hole 6 do not come into direct contact with each other, the copper can be prevented from being diffused into the insulating film and, as a result, occurrence of a problem such as a leak between wirings can be prevented.

Since the plasma process using a reducing gas is not performed before formation of the first barrier metal film 8c, for example, different from the second prior art, the insulating film as a low dielectric constant film can be prevented from being damaged by the reducing gas. As a result, increase in the dielectric constant of the low dielectric constant film can be prevented.

As the first barrier metal film 8c is formed without performing sputter etching using argon gas, the barrier metal film can be formed on the side face having little roughness on which deposits hardly exist. Thus, a barrier metal film having relatively uniform thickness can be formed and, in addition, the film thickness can be reduced.

In the second embodiment, by forming the second barrier metal film 8g prior to formation of the copper film 8d as a seed layer, the copper film 8d is formed on the second barrier metal film 8g and is not directly formed on the insulating substances such as an oxide and a residual polymer generated at the time of exposing the top face of the first wiring 2. Therefore, the interface between the copper film 8d and the second barrier metal film 8g is in a preferable state, so that the characteristic of filling of copper to the connection hole 6 and the second wiring trench 7 is further improved, and reliability is further improved.

By performing the plasma process using hydrogen gas after the sputter etching using argon gas, the insulating substances such as the oxide and residual polymer included in the first to third deposits 9a to 9c can be reduced and removed. Consequently, excellent wettability can be assured in the interface with the second barrier metal film 8g which is a tantalum film formed on the first barrier metal film 8c, so that the second barrier metal film 8g is the tantalum film having excellent film quality and alignment. Thus, the characteristic of filling to the connection hole 6 and the second wiring trench 7 is further improved and the reliability of preventing a failure such as electro-migration and stress migration is further improved.

At the time of performing a plasma process using hydrogen gas, not the bottom of the connection hole 6 but the side walls of the connection hole 6, the side walls and bottom of the second wiring trench 7, and the surface of the third insulating film 5 are covered with the first barrier metal film 8c, so that the second insulating film 4 as a low dielectric constant film can be prevented from being damaged by the plasma process using hydrogen gas. As a result, increase in the dielectric constant of the low dielectric constant film can be prevented.

Although the sputter etching using argon gas, the plasma process using a reducing gas, and the like are not performed prior to formation of the tantalum nitride film 8a and the tantalum film 8b as the first barrier metal film 8c in the second embodiment, it is preferable to perform an annealing process using hydrogen gas as a reducing gas. For example, by performing the annealing process using hydrogen gas at 150 to 400° C. for 30 seconds in the same apparatus as the sputtering apparatus, a natural oxide film formed on the first wiring 2 can be removed to a certain extent. The cleanliness of the interface between the first wiring 2 and the first barrier metal film 8c formed on the first wiring 2 is improved. Therefore, insulating substances such as an oxide and residual polymer generated at the time of exposing the first wiring 2 can be effectively reduced and removed by the process using the reducing gas. Since the interface is cleaned by the annealing process as described above, the second insulating film 4 as a low dielectric constant film is not damaged.

Although the case of forming the first barrier metal film 8c by sputtering has been described in the second embodiment, the first barrier metal film 8c may be formed by CVD. In this case, when a plasma process using the reducing gas is performed, the film quality, for example, crystallinity of the first barrier metal film 8c formed by CVD is improved. Therefore, effects such as higher density of the first barrier metal film 8c, reduction of impurities in the film, and removal of impurities in the film are produced. Thus, the characteristic of filling to the connection hole 6 and the second wiring trench 7 is improved and resistance to electromigration and stress migration is improved, so that reliability is improved.

Although the dual damascene method for simultaneously filling copper into the connection hole 6 and the second wiring trench 7 has been described in the second embodiment, obviously, the invention can be similarly carried out by a single damascene method for filling copper to each of the connection hole 6 and the second wiring trench 7.

In the second embodiment, the insulating substances such as the oxide and residual polymer deposited on the side walls of the connection hole 6 and the second wiring trench 7 are removed by the plasma process using reducing gas in the process shown in FIG. 3C. The insulating substances such as the oxide and residual polymer can be similarly reduced also in the case of performing an annealing process using reducing gas in place of the plasma process using reducing gas. Therefore, also in the case of performing the annealing process using reducing gas, effects similar to the above can be obtained.

In the second embodiment, the case where the first barrier metal film 8c formed before sputter etching using argon gas has the two-layer structure in which the tantalum nitride film 8a and the tantalum film 8b are stacked to improve wettability with copper prior to formation of the copper film 8d as a seed layer has been described. Alternately, the first barrier metal film 8c may have a single-layer structure of the tantalum nitride film 8a.

The low dielectric constant film used in the embodiment may be an organic film (SiOC, BCB, MSQ, FLARE, or porous organic film), a film containing a methyl group or benzene ring, an inorganic film (HSQ or porous SiO), and the like.

According to the method for fabricating an electronic device of the first and second embodiments of the invention, for example, conductive substances such as copper can be prevented from being in direct contact with an insulating film and being diffused into the film, so that occurrence of a problem such as a leak between wirings can be prevented. Therefore, the invention is useful for a wiring technique using a combination of copper wiring and a low dielectric constant film.

What is claimed is:

1. A method for fabricating an electronic device, comprising:
   a step of forming a first conductor to become a wiring or a wiring plug in a first insulating film;
   a step of forming a second insulating film on said first insulating film and said first conductor and, after that, forming a hole reaching the top face of said first conductor in said second insulating film;
   a step of forming a first barrier metal film on a bottom and side walls of said hole and on said second insulating film;
   a step of removing a portion formed on the bottom of said hole in said first barrier metal film to thereby expose the top face of said first conductor;
   a step of performing a plasma process using a reducing gas after the step of exposing the top face of said first conductor; and
   a step of forming a second conductor to become a wiring plug or a wiring by filling a conductive film in said hole after the step of performing said plasma process.

2. The method for fabricating an electronic device according to claim 1, further comprising a step of forming a second barrier metal film on said first barrier metal film and said first conductor exposed in said hole, between the step of performing said plasma process and the step of forming said second conductor.

3. The method for fabricating an electronic device according to claim 1, further comprising a step of performing an annealing process using a reducing gas between the step of forming said hole and the step of forming said first barrier metal film.

4. The method for fabricating an electronic device according to claim 1, wherein the step of exposing the top face of said first conductor includes at least a step of removing said first barrier metal film in said hole on said first conductor.

5. The method for fabricating an electronic device according to claim 1, wherein the step of exposing the top face of said first conductor includes a step of making said first barrier metal film formed on the side walls of said hole and on the outside of said hole remain.

6. The method for fabricating an electronic device according to claim 1, wherein said second insulating film is a low dielectric constant film.

7. A method for fabricating an electronic device, comprising:
   a step of forming a first conductor to become a wiring or a wiring plug in a first insulating film;
   a step of forming a second insulating film on said first insulating film and said first conductor and, after that, forming a hole reaching the top face of said first conductor in said second insulating film;
   a step of forming a first barrier metal film on a bottom and side walls of said hole and on said second insulating film;
   a step of removing a portion formed on the bottom of said hole in said first barrier metal film to thereby expose the top face of said first conductor;
   a step of performing an annealing process using a reducing gas after the step of exposing the top face of said first conductor; and
   a step of forming a second conductor to become a wiring plug or a wiring by filling a conductive film in said hole after the step of performing said annealing process.

8. The method for fabricating an electronic device according to claim 7, further comprising a step of forming a second barrier metal film on said first barrier metal film and said first conductor exposed in said hole, between the step of performing said annealing process and the step of forming said second conductor.

9. The method for fabricating an electronic device according to claim 7, further comprising a step of performing an annealing process using a reducing gas between the step of forming said hole and the step of forming said first barrier metal film.

10. The method for fabricating an electronic device according to claim 7, wherein the step of exposing the top face of said first conductor includes at least a step of removing said first barrier metal film in said hole on said first conductor.

11. The method for fabricating an electronic device according to claim 7, wherein the step of exposing the top face of said first conductor includes a step of making said first barrier metal film formed on the side walls of said hole and on the outside of said hole remain.

12. The method for fabricating an electronic device according to claim 7, wherein said second insulating film is a low dielectric constant film.

\* \* \* \* \*